(12) United States Patent
Then et al.

(10) Patent No.: US 10,546,927 B2
(45) Date of Patent: Jan. 28, 2020

(54) SELF-ALIGNED TRANSISTOR STRUCTURES ENABLING ULTRA-SHORT CHANNEL LENGTHS

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US); Sanaz K. Gardner, Portland, OR (US); Seung Hoon Sung, Portland, OR (US)

(73) Assignee: INTEL Corporation, Santa Clara, CA (US)

( * ) Notice: Subject to any disclaimer, the term of this patent is extended or adjusted under 35 U.S.C. 154(b) by 0 days.

(21) Appl. No.: 15/774,064

(22) PCT Filed: Dec. 7, 2015

(86) PCT No.: PCT/US2015/064224
§ 371 (c)(1),
(2) Date: May 7, 2018

(87) PCT Pub. No.: WO2017/099707
PCT Pub. Date: Jun. 15, 2017

(65) Prior Publication Data
US 2018/0331182 A1    Nov. 15, 2018

(51) Int. Cl.
*H01L 29/267* (2006.01)
*H01L 29/66* (2006.01)
*H01L 29/08* (2006.01)

(52) U.S. Cl.
CPC ........ *H01L 29/0847* (2013.01); *H01L 29/267* (2013.01); *H01L 29/66431* (2013.01)

(58) Field of Classification Search
CPC ............. H01L 29/0847; H01L 29/4232; H01L 29/4236; H01L 29/7786; H01L 29/66477;
(Continued)

(56) References Cited

U.S. PATENT DOCUMENTS 5,045,922 A * 9/1991 Kodama ............. H01L 23/5383
257/698
9,041,061 B2    5/2015 Majumdar et al.
(Continued)

FOREIGN PATENT DOCUMENTS

WO    2017/099707 A1    6/2017

OTHER PUBLICATIONS

International Search Report and Written Opinion received for PCT Application No. PCT/US2015/064224, dated Aug. 18, 2016. 12 pages.
(Continued)

*Primary Examiner* — Caridad Everhart
(74) *Attorney, Agent, or Firm* — Finch & Maloney PLLC

(57) ABSTRACT

Techniques are disclosed for forming self-aligned transistor structures including two-dimensional electron gas (2DEG) source/drain tip portions or tips. In some cases, the 2DEG source/drain tips utilize polarization doping to enable ultra-short transistor channel lengths of less than 20 nm, for example, and create highly conductive, thin source/drain tip portions in transistor devices. In some instances, the 2DEG source/drain tips can be formed by self-aligned regrowth of a polarization layer over a base III-V compound layer and on either side of a dummy gate, in locations to be substantially covered by spacers. In some cases, the III-V base layer may include gallium nitride (GaN) or indium gallium nitride (InGaN), for example, and the polarization layer may include aluminum indium nitride (AlInN), aluminum nitride
(Continued)

(AlN), aluminum gallium nitride (AlGaN), or aluminum indium gallium nitride (AlInGaN), for example.

20 Claims, 5 Drawing Sheets

(58) Field of Classification Search
CPC ........... H01L 29/7783; H01L 29/66431; H01L 29/785
See application file for complete search history.

(56) References Cited

U.S. PATENT DOCUMENTS

| | | |
|---|---|---|
| 2006/0148182 A1 | 7/2006 | Datta et al. |
| 2008/0303121 A1* | 12/2008 | Lin ........................ H01L 23/367 257/664 |
| 2009/0267078 A1* | 10/2009 | Mishra ................ H01L 29/2003 257/76 |
| 2010/0025730 A1 | 2/2010 | Heikman et al. |
| 2013/0334538 A1 | 12/2013 | Saunier |
| 2016/0330795 A1* | 11/2016 | Choi ................... H01L 21/8258 |

OTHER PUBLICATIONS

International Preliminary Report on Patentability received for PCT Application No. PCT/US2015/064224, dated Jun. 12, 2018. 8 pages.

* cited by examiner

SELF-ALIGNED TRANSISTOR STRUCTURES ENABLING ULTRA-SHORT CHANNEL LENGTHS

BACKGROUND

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers flow from the source to the drain. Some FETs have a fourth terminal called, the body or substrate, which serves to bias the transistor into operation. A metal-oxide-semiconductor FET (MOSFET) uses an insulator between the gate and the body of the transistor and MOSFETs can be used for amplifying or switching electronic signals. MOSFETs are commonly found in both digital and analog circuits. MOSFETs typically include side-wall spacers, referred to generally as spacers, on either side of the gate that help determine the channel length and help with replacement gate processes, for example. In some cases, portions of the source and/or drain regions of a transistor extend under the spacers (and in some cases, under the gate), and such portions are generally referred to as source/drain extensions or tips.

Figure 1:
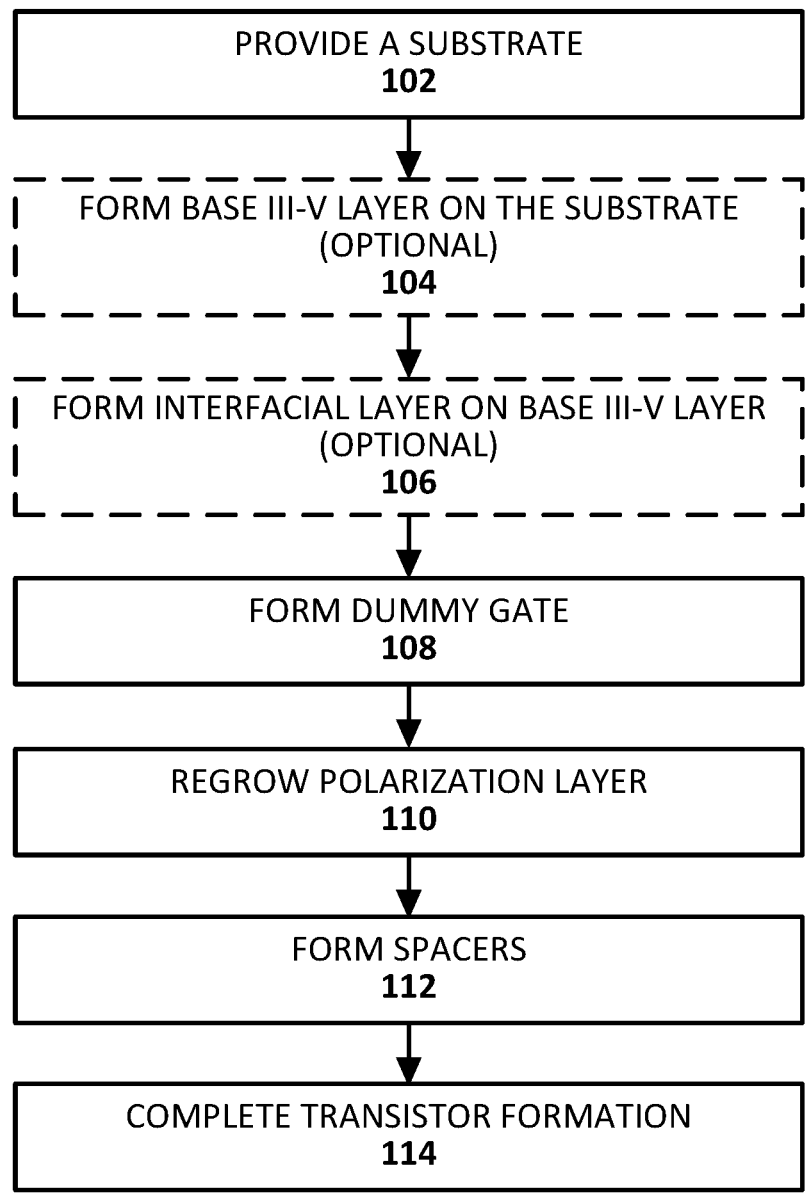
FIG. 1 illustrates a method of forming an integrated circuit, in accordance with various embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming self-aligned transistor structures including two-dimensional electron gas (2DEG) source/drain tip portions or tips. In some cases, the 2DEG source/drain tips utilize polarization doping to enable ultra-short transistor channel lengths of less than 20 nm, for example, and create highly conductive, thin source/drain tip portions in transistor devices. In some instances, the 2DEG source/drain tips can be formed by self-aligned regrowth of a polarization layer over a base III-V semiconductor compound layer and on either side of a dummy gate, in locations to be substantially covered by spacers. The 2DEG configuration is formed at or near the interface between the polarization layer and the base III-V layer, where the bandstructure creates a quantum well (QW) for charges to flow along. In some cases, the III-V base layer may include gallium nitride (GaN) or indium gallium nitride (InGaN), for example, and the polarization layer may include aluminum indium nitride (AlInN), aluminum nitride (AlN), aluminum gallium nitride (AlGaN), or aluminum indium gallium nitride (AlInGaN), for example. In some instances, one or more optional interfacial layers (e.g., an AlN layer) may be included between the base III-V layer and the polarization layer to, for example, increase carrier mobility. Numerous variations and configurations will be apparent in light of this disclosure.

General Overview

As previously described, portions of the source and/or drain regions of a transistor extend under the spacers (and in some cases, under the gate), and such portions are generally referred to as source/drain extensions or tips. Transistor source/drain tip scaling is an issue facing Moore's law, particularly with continual physical scaling of transistors and increased demands in computation density. A good transistor source/drain tip should be conductive in order to not contribute significantly to external resistance (Rext). Issues of Rext may be addressed by having a thicker layer of conductive material. However, such thicker tips contribute to transistor off-state leakage in transistor areas away from the gate, which inhibits physical scaling. In addition, a typical source/drain tip is produced via implant and activation/diffusion at high temperatures. Such diffusion can result in tip overrun, decreasing the gate length (Lg) beyond what is desired, as well as leading to an increase in Lg variability. Therefore, improvements in transistor source/drain tip portions are needed to meet increased transistor scaling, without negatively impacting other aspects of the transistor device.

Thus, and in accordance with one or more embodiments of the present disclosure, techniques are provided for forming self-aligned transistor structures including two-dimensional electron gas (2DEG) source/drain tip portions or tips. In some embodiments, the 2DEG source/drain tips utilize polarization doping to enable ultra-short transistor channel lengths of less than 20 nm, for example, and create highly conductive, thin source/drain tip portions in transistor devices. In some embodiments, the 2DEG source/drain tips can be formed by self-aligned regrowth of a polarization layer over a base III-V semiconductor compound layer and on either side of a dummy gate, in locations to be substantially covered by spacers. As variously used herein, III-V compounds/materials include at least one group III element (e.g., aluminum, gallium, indium, boron, thallium) and at least one group V element (e.g., nitrogen, phosphorus, arsenic, antimony, bismuth). In some embodiments, the III-V base layer may include gallium nitride (GaN) or indium gallium nitride (InGaN), for example, and the polarization layer may include aluminum indium nitride (AlInN), aluminum nitride (AlN), aluminum gallium nitride (AlGaN), or aluminum indium gallium nitride (AlInGaN), for example. However, numerous different suitable III-V compounds/materials for both the polarization layer and the III-V base layer will be apparent based on the present disclosure. For example, in some embodiments, group III element-nitride (III-N) compounds/materials may be particularly well-suited for the III-V base layer and polarization layer, due to III-N materials having high bandgaps and other desirable properties. III-N materials, as variously used herein, include a compound of one or more group III materials (e.g., aluminum, gallium, and/or indium), with some nitrogen. Accordingly, III-N materials/compounds as variously used herein include, but are not limited to, GaN, InN, AlN, AlInN, AlGaN, InGaN, and AlInGaN. As can also be understood based on the present disclosure, the 2DEG configuration is formed at or near the interface between the polarization layer and the base III-V layer, where the bandstructure creates a quantum well (QW) for charges to flow along. In some embodiments, the structure may include one or more optional interfacial layers between the base III-V layer and the polarization layer to, for example, increase carrier mobility. For example, in an embodiment, the interfacial layer may be a very thin AlN layer, having a thickness of approximately 1 nm, for example.

In some embodiments, the base III-V layer may be a bulk III-V substrate, while in some embodiments, the base III-V layer may be formed on a separate substrate, such as a silicon (Si), germanium (Ge), silicon germanium (SiGe), silicon carbide (SiC), or other suitable substrate, depending on the end use or target application. For example, in an embodiment, the transistor structures variously described herein may be III-V material n-type MOSFET (n-MOS) structures formed on a Si substrate, and such III-V n-MOS structures may be combined with p-type MOSFET (p-MOS) structures (e.g., Si p-MOS) to form complementary MOSFET (CMOS) devices. As will be apparent in light of the present disclosure, the techniques variously described herein can be used to form 2DEG source/drain tips in numerous different transistor configurations, such as planar configurations, dual-gate configurations, finned configurations (e.g., FinFET or tri-gate), and gate-all-around configurations (e.g., including one or more nanowires or nanoribbons). In addition, the techniques variously described herein can be used to form 2DEG source/drain tips for n-MOS, p-MOS, and CMOS structures. In some embodiments, the techniques variously described herein may be used to form a 2DEG tip for only one of the source and drain regions. In some such embodiments, a polarization layer may only be present under the transistor spacer on the side of one of the source and drain regions. Therefore, the use of "source/drain" herein is to be interpreted as the source and/or the drain, and thus "source/drain" includes: just the source (or source region); just the drain (or drain region); and both the source and drain (source and drain regions).

Numerous benefits of forming a transistor with 2DEG source/drain tips will be apparent in light of the present disclosure. For example, the 2DEG tips variously described herein need not include implant and diffusion processes, and thus there is significantly minimized or no tip overrun due to the high temperatures used during a diffusion process. Moreover, such tip overrun (which can occur during typical tip formation that includes implant and diffusion processes), can decrease Lg in an undesirable manner. Therefore the techniques variously described herein can be used to increase Lg (or to at least not lose Lg as a result of the tip formation process) and also can be used to increase Lg consistency within a given die, enabling the formation of high performance transistors (e.g., logic transistors). Further, another benefit of the 2DEG tips variously described herein is that the 2DEG tips may have very shallow depths (e.g., 5 nm or less) as well as low sheet resistance (e.g., 250 Ohm/sq. or less) leading to high conductivity/mobility, according to some embodiments. Further still, another benefit of the 2DEG tips variously described herein is that the 2DEG tips may have a large/wide bandgap, providing numerous advantages such as improved short channel effects (SCEs), no gate-induced drain leakage (GIDL), no hot-electron stress, and improved leakage current, in some embodiments. Further yet, the 2DEG tips variously described herein can be used with non-planar or 3D transistor architecture, such as dual-gate, finned, FinFET, tri-gate, nanowire, and nanoribbon transistor configurations, in some embodiments. In some such embodiments, formation of 2DEG tips provides advantages over typical tip formation because 2DEG tip formation avoids difficult angled implants and solutions involving boronsilicate glass (BSG), phosphosilicate glass (PSG), or boronphosphosilicate glass (BPSG), for example.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, high resolution physical or chemical analysis, to name a few suitable example analytical tools. In particular, such tools may indicate a structure or device configured with 2DEG source/drain tips as variously described herein. For example, in some embodiments, such structures including 2DEG source/drain tips may include a polarization layer (e.g., an AlInN, AlN, AlGaN, or AlInGaN layer) over a III-V base layer (e.g., a GaN or InGaN layer) in areas underneath the transistor spacers. In some such embodiments, the 2DEG tips may also include one or more interfacial layers between the polarization layer and III-V base layer, such as a thin AlN layer, for example. In some cases, use of 2DEG source/drain tips may be detected by sensing a significant polarization vector in the device. In some embodiments, 2DEG as variously used herein includes two-dimensional hole gas (2DHG) configurations, such that 2DEG may be considered, in some embodiments, to refer to a gas of carriers (e.g., electrons or holes) free to move in two dimensions but tightly confined in the third. In some cases, use of the techniques variously described herein may be detected based on the benefits derived from use of 2DEG tips for a transistor device, such as improved Lg consistency, improved conductivity/mobility, improved SCEs, no GIDL, no hot-electron stress, improved leakage current, and/or any other benefit achieved from use of the techniques variously described herein. Numerous configurations and variations will be apparent in light of this disclosure.

Architecture and Methodology

FIG. 1 illustrates a method 100 of forming an integrated circuit, in accordance with one or more embodiments of the present disclosure. FIGS. 2A-F illustrate example integrated circuit structures that are formed when carrying out method 100 of FIG. 1, in accordance with various embodiments. As will be apparent in light of the structures formed, method 100 discloses techniques for forming transistor source/drain tip portions (also referred to as extensions or tips) including a two-dimension electron gas (2DEG) configuration. The structures of FIGS. 2A-F are primarily depicted and described herein in the context of forming 2DEG tips in both the source and drain regions of the transistor device. However, in some embodiments, the techniques can be used to form a 2DEG tip for only one of the source and the drain of a transistor device, depending on the end use or target application. Further, the structures of FIGS. 2A-F are primarily depicted and described herein in the context of forming a planar transistor device. However, in some embodiments, the techniques can be used to form 2DEG source/drain tips for non-planar transistor configurations, such as dual-gate configurations, finned configurations (e.g., FinFET or tri-gate), or gate-all-around configurations (e.g., including one or more nanowires or nanoribbons). Further still, the structures of FIGS. 2A-F are primarily described herein in the context of forming an n-type transistor device, and more specifically, an n-MOS transistor. However, in some embodiments, the techniques can be used to form 2DEG source/drain tips for p-type transistor devices and/or the structures formed may be included in CMOS devices where either or both of the included p-type and n-type transistors may benefit from 2DEG source/drain tips as variously described herein. Further yet, the techniques as variously described herein may be used with devices of varying scales, such as transistor devices in the micrometer range or transistor devices in the nanometer range (e.g., transistors formed at the 22, 14, 10, 7, or 5 nm process nodes, or beyond).

Figure 2A:
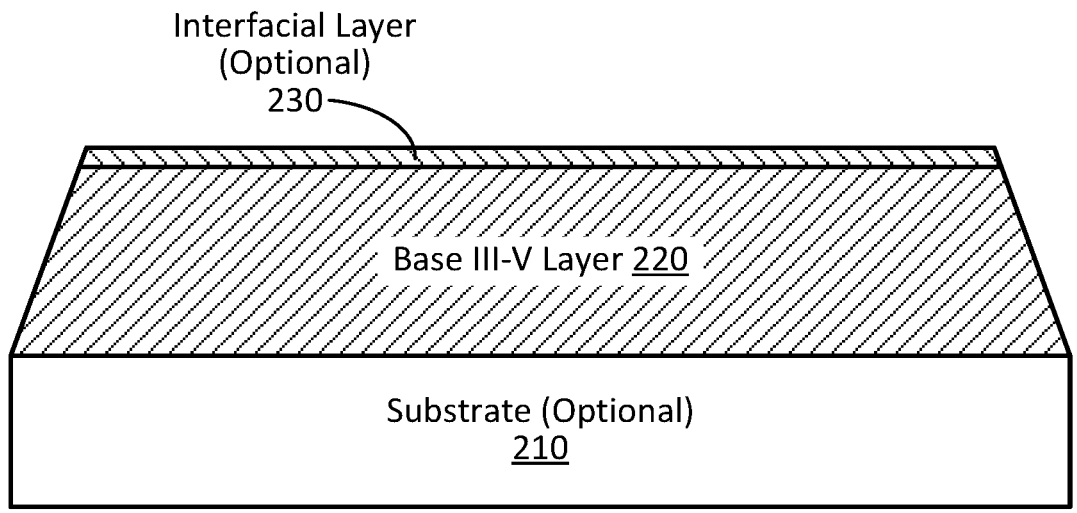
FIGS. 2A-F illustrate example integrated circuit structures that are formed when carrying out the method of FIG. 1, in accordance with various embodiments.

Method 100 of FIG. 1 includes providing 102 a substrate and optionally forming 104 a base III-V layer on the substrate to form the example resulting structure shown in FIG. 2A, in accordance with an embodiment. In this example embodiment, the base III-V layer 220 is formed above optional substrate 210. Substrate 210 is optional, because in some embodiments, the base III-V layer 220 may be a bulk III-V wafer, such that the base III-V layer is not formed on or above another material substrate, for example. However, in the example embodiment shown in FIG. 2A, substrate 210 is present and base III-V layer 220 is formed above and on substrate 210. In some embodiments, substrate 210 may be a bulk substrate of one or more group IV materials/compounds, such as a bulk Si, Ge, SiC, or SiGe substrate, or substrate 210 may be a sapphire substrate, or substrate 210 may include any other suitable material, depending on the end use or target application. In some embodiments, substrate 210 may be an X on insulator (XOI) structure where X comprises Si, Ge, SiC, SiGe, or sapphire, and the insulator material is an oxide material or dielectric material or some other electrically insulating material. Although substrate 210 is illustrated in FIG. 2A as having a similar thickness as base III-V layer 220, in some instances substrate 200 may be much thicker than base layer 220, such as on the order of at least 10, 100, or 1000 times thicker. For example, where substrate 210 is a bulk substrate, it may have a thickness T1 (indicated in FIG. 2C) in the range of 50 to 950 microns. In some embodiments, substrate 210 may be used for one or more other integrated circuit (IC) devices, such as various diodes (e.g., light-emitting diodes (LEDs) or laser diodes), various transistors (e.g., MOSFETs or tunnel FETs (TFETs)), various microelectromechanical systems (MEMS), various nanoelectromechanical systems (NEMS), various sensors, or any other suitable semiconductor or IC devices, depending on the end use or target application. Accordingly, in some embodiments, the FBAR structures may be included in various different system-on-chip (SoC) applications, as will be apparent in light of the present disclosure.

In some embodiments, formation 104 of base III-V layer 220 may include any suitable deposition or growth process or processes, such as a metal-organic chemical vapor deposition (MOCVD) or molecular-beam epitaxy (MBE) process, for example. In some embodiments, base III-V layer 220 may include any suitable materials, such as GaN, InGaN, other III-N materials, or any other suitable III-V material, depending on the end use or target application. In some embodiments, base III-V layer 220 may have a multilayer structure including multiple III-V materials, which may or may not include grading (e.g., increasing and/or decreasing content) of one or more materials throughout the multilayer structure. Note that, in some embodiments, designation of a layer as a III-V layer or a III-V semiconductor material layer means that the layer includes at least one III-V semiconductor material, but may also include other materials, such as one or more dopants (e.g., p-type or n-type) or other materials as depending on the end use or target application. In some embodiments, base III-V layer 220 may be formed to have a thickness T2 (indicated in FIG. 2C) between 50 nm and 1 micron, or any other suitable thickness, depending on the end use or target application. In embodiments where substrate 210 is not present and base III-V layer 220 is a bulk wafer, then base III-V layer 220 may be substantially thicker, such as greater than 50 microns in thickness, for example. In some embodiments, particularly where base III-V layer 220 is formed on a non-III-V material substrate (e.g., on a Si, Ge, SiGe, SiC, or sapphire substrate), a nucleation layer (not shown) may be formed between base III-V layer 220 and substrate 210 to, for example, improve growth conditions and/or prevent the base III-V layer 220 from reacting with the substrate material. In some such embodiments, nucleation layer may be AlN or a low temperature GaN layer (e.g., epitaxially grown at a temperature in the range of 700 to 950 degrees Celsius), for example. Further, in some such embodiments, nucleation layer may have any suitable thickness, such as a thickness of 10 nm to 1 micron (e.g., approximately 20 nm), or any other suitable thickness depending on the end use or target application.

Method 100 of FIG. 1 continues with optionally forming 106 interfacial layer 230 on base III-V layer 220, which can also be seen in the example structure of FIG. 2A, in accordance with an embodiment. In some embodiments, interfacial layer 230 may be present to increase carrier mobility in the 2DEG source/drain tip structure, for example. In some embodiments, formation 106 of interfacial layer 230 may include any suitable deposition or growth process or processes, such as an MOCVD or MBE process, for example. In some embodiments, interfacial layer 230 may include a III-N material (e.g., GaN, InN, AlN, AlInN, AlGaN, InGaN, and AlInGaN), or any other suitable material depending on the end use or target application. In some embodiments, interfacial layer 230 may have a multilayer structure including multiple III-V and/or III-N materials, which may or may not include grading (e.g., increasing and/or decreasing content) of one or more materials throughout the multilayer structure. In some embodiments, interfacial layer 230 may have a thickness T3 (indicated in FIG. 2C) of 0.1-5 nm (e.g., approximately 1 nm), or any other suitable thickness depending on the end use or target application.

Figure 2B:
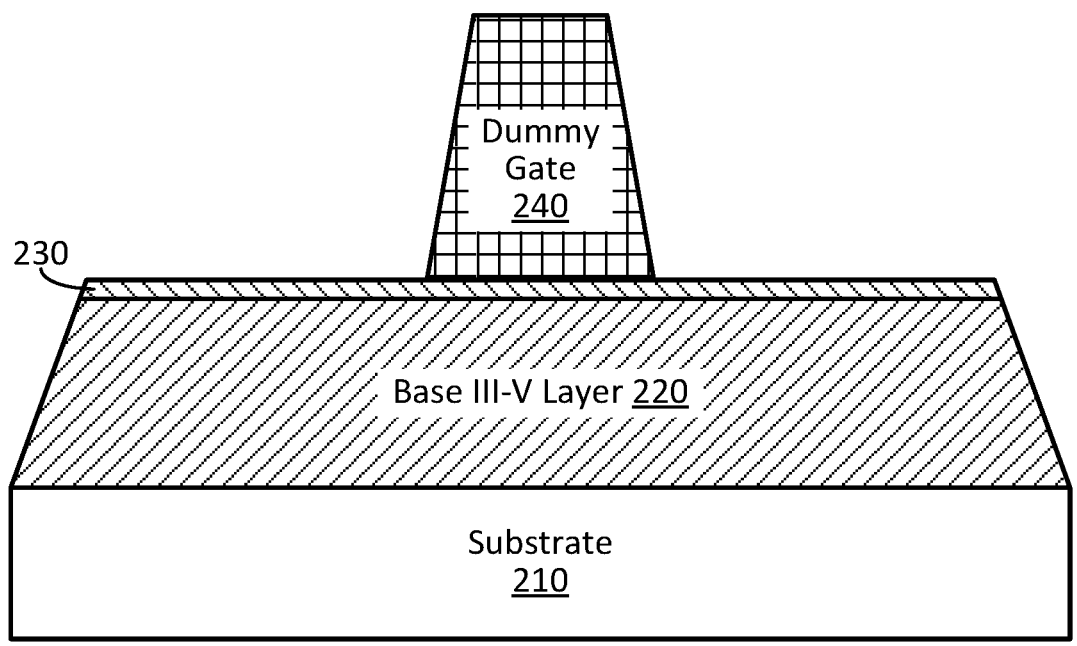

Method 100 of FIG. 1 continues with forming 108 dummy gate 240 to form the example resulting structure shown in FIG. 2B, in accordance with an embodiment. In some embodiments, formation 108 of dummy gate 240 may include dummy gate oxide deposition, dummy gate electrode (e.g., poly-Si) deposition, and patterning hardmask deposition, for example. Such deposition processes may include any suitable deposition techniques, such as chemical vapor deposition (CVD), atomic layer deposition (ALD), physical vapor deposition (PVD), and/or any other suitable process, depending on the desired dummy gate 240. Additional processing may include patterning the dummy gate 240 material to form the example structure shown in FIG.

2B. As can be understood based on the present disclosure, dummy gate 240 is used as a sacrificial structure to allow for the formation of other components, such as the spacers, for example. Accordingly, the dummy gate, in this example embodiment, can be used as a place holder to be later removed and replaced by a metal gate.

Figure 2C:
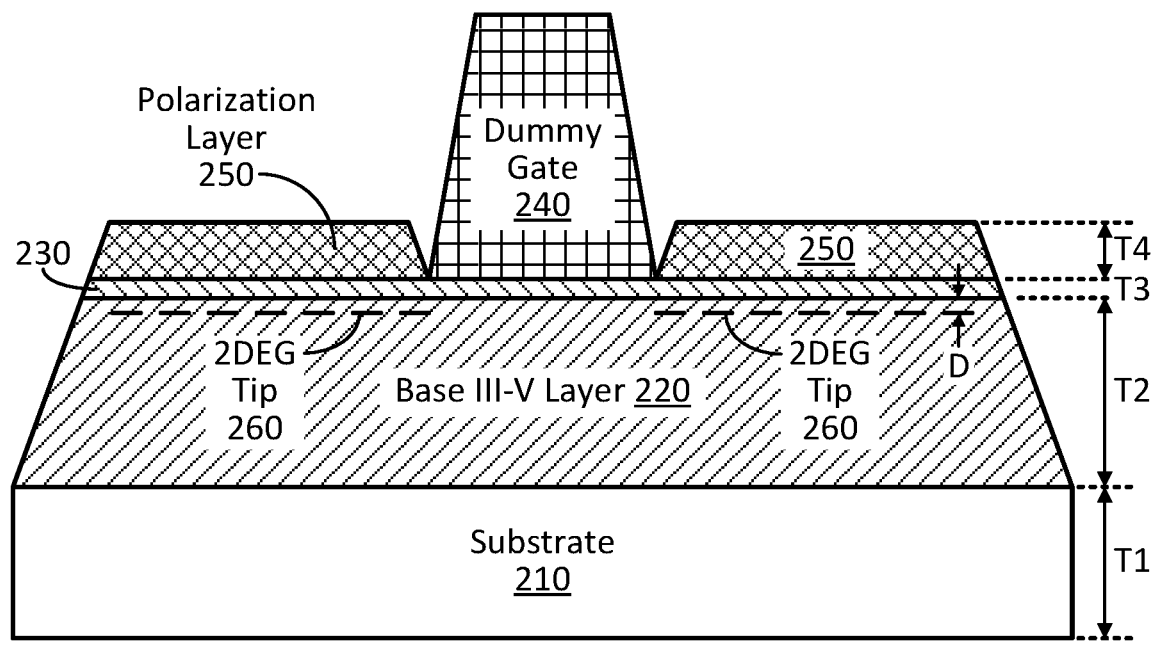

Method 100 of FIG. 1 continues with regrowing 110 polarization layer 250 to form the example resulting structure shown in FIG. 2C, in accordance with an embodiment. In some embodiments, regrowth 110 may be performed using any suitable deposition or growth process or processes, such as an MOCVD or MBE process, for example. Additional processing may include patterning the polarization layer 250 to the shape shown in FIG. 2C, in this example embodiment. In some embodiments, polarization layer may include a III-N material (e.g., GaN, InN, AlN, AlInN, AlGaN, InGaN, and AlInGaN), or any other suitable material, depending on the end use or target application. In some embodiments, polarization layer 250 may have a multilayer structure including multiple III-V materials or III-N materials, which may or may not include grading (e.g., increasing and/or decreasing content) of one or more materials throughout multilayer structure. In some embodiments, polarization layer 250 may have a thickness T4 of 2-100 nm (e.g., 5-10 nm), or any other suitable thickness depending on the end use or target application. In some cases, the thickness and composition of the polarization layer may dictate the magnitude of the polarization vector formed, and thus the amount of charge (and corresponding conductivity) in the tip portion. In some cases, the thickness of the polarization layer 250 may be selected based on the lattice matching between the base III-V layer 220 (and/or interfacial layer 230, where present) and the polarization layer 250.

FIG. 2C also illustrates the 2DEG tips 260 created at or near the interface of the polarization layer 250 and the base III-V layer 220. As previously described, the 2DEG configuration creates a quantum well for charges to flow along. 2DEG tip portions 260 are used in this example embodiment instead of implanted tips which include anneal processes to diffuse/activate such implanted tips. Some of the benefits of using 2DEG tips over implanted tips are described herein, such as the lack of tip overrun and related issues caused by tip overrun, for example. In this example embodiment, the 2DEG in tip portions 260 may have a depth D of 1-20 nm (e.g., 2-5 nm), or any other suitable thickness depending on the end use or target application. Note that the depth D is measure as the depth into the base III-V layer 220 from the top of the layer. In some cases, the depth D of the 2DEG tips may be dictated by the thickness T2 and/or composition of base III-V layer 220, the thickness T3 and/or composition of optional interfacial layer 230, and/or the thickness T4 and/or composition of polarization layer 250, for example. Being able to achieve a shallow depth D for the tip portions 260 is beneficial, as it leads to reduced sheet resistance, which leads to high conductivity/mobility.

Figure 2D:
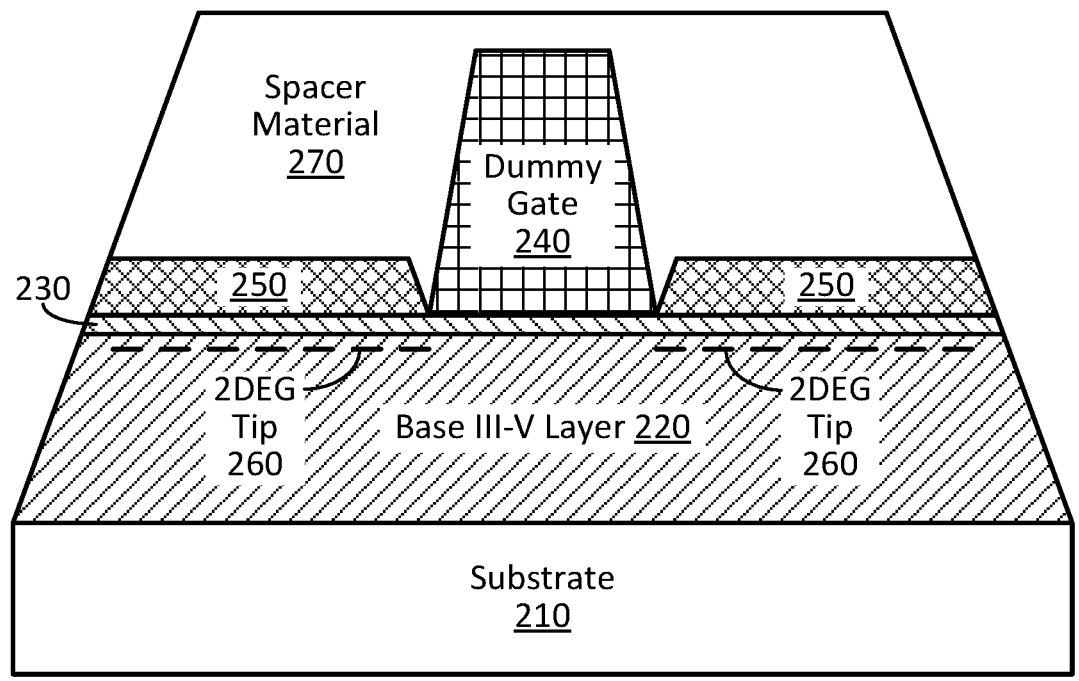
Figure 2E:
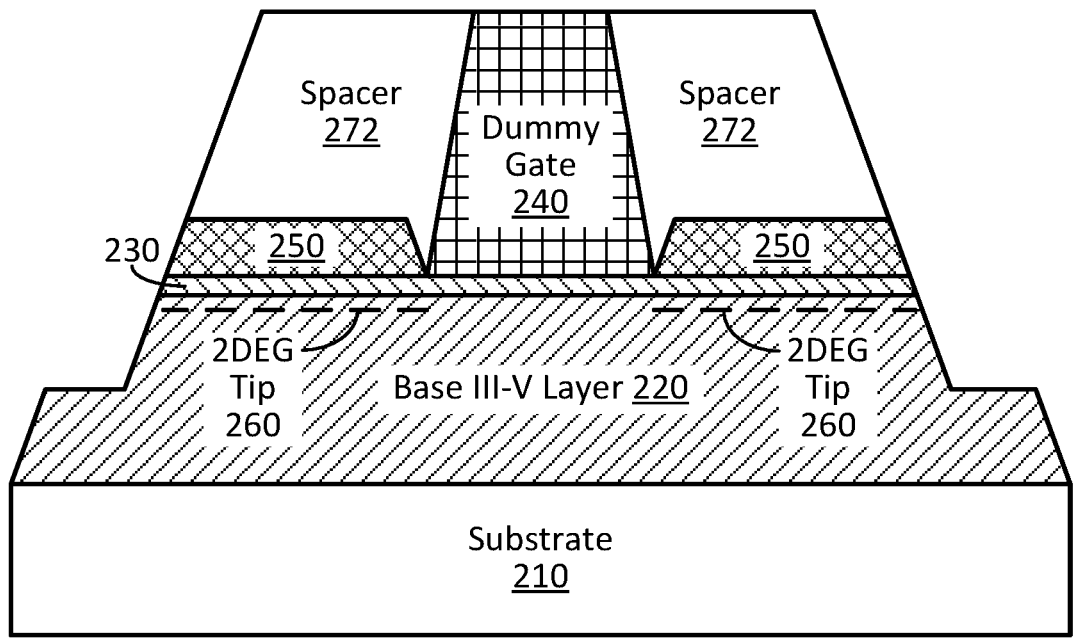

Method 100 of FIG. 1 continues with forming 112 spacers 272 illustrated in the example resulting structure of FIG. 2E, in accordance with an embodiment. Formation of spacers 272, in this example embodiment, may include depositing spacer material 270 as shown in FIG. 2D, for example. Deposition of spacer material 270 may include any suitable techniques, such as CVD, ALD, PVD, and/or any other suitable process as will be apparent in light of the present disclosure. In some embodiments, spacer material may include any suitable materials, such as silicon oxide or silicon nitride, for example. Spacer formation 112, in this example embodiment, also included a planarization process to form the resulting structure shown in FIG. 2E. As can be seen in FIG. 2E, planarization layer 250 is located under spacers 272, in this example embodiment. Note that such a planarization process may be performed later in method 100, such as after the doped source and drain regions have been formed, for example. Also note that portions of the sides of the structure of FIG. 2D have been removed via wet and/or dry etch processes to form the structure of FIG. 2E and to prepare for source/drain regrowth.

Figure 2F:
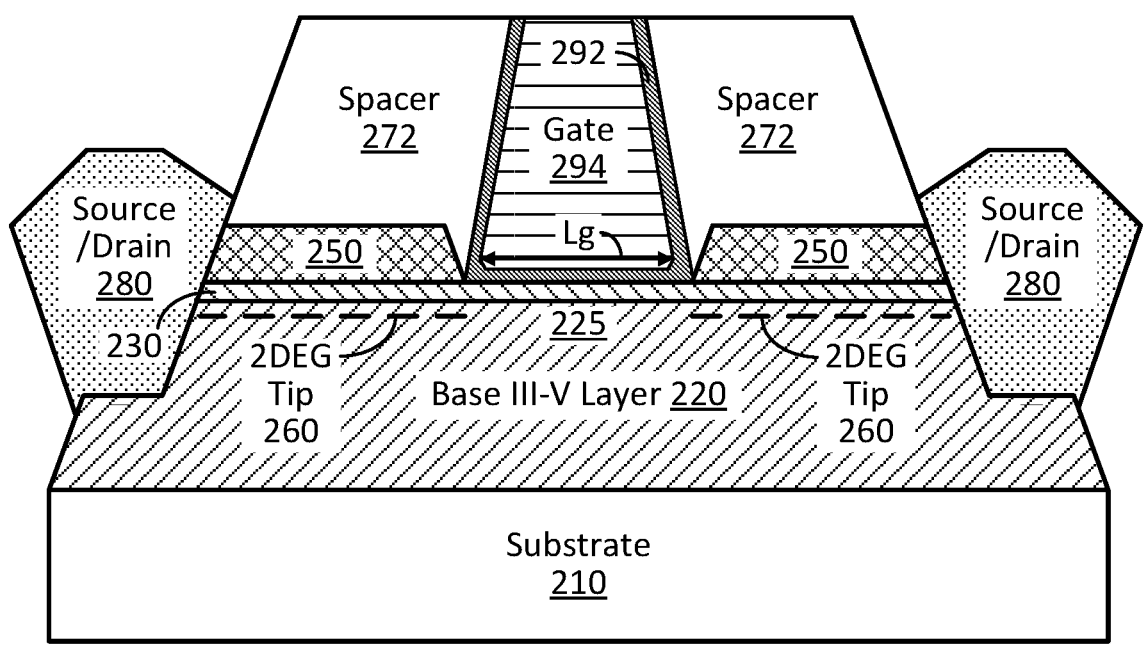

Method 100 of FIG. 1 continues with completing 114 transistor formation to form the example resulting structure of FIG. 2F, in accordance with an embodiment. The additional processes performed for completing 114 the transistor formation, in this example embodiment, include source/drain 280 regrowth and replacement metal gate processes. Source/drain 280 regrowth may be performed using any suitable techniques, such as deposition using MOCVD or MBE processes, or any other suitable processes as will be apparent in light of the present disclosure. In some embodiments, source/drain 280 may include any suitable materials, such as indium nitride (InN) or InGaN, or any other suitable materials depending on the end use or target application. Further, such materials may be doped, in some embodiments, such as with an n-type dopant (e.g., heavily doped with Si) in the case of n-MOS configurations, for example. As can be understood based on the present disclosure, in this example embodiment, 2DEG tips 260 are extensions of source/drain regions 280. Note that although the 2DEG tips 260 are shown as having the same length (e.g., the same length under spacers 272), the present disclosure is not intended to be so limited. For example, in some embodiments, the length between the implanted source (e.g., one of source/drain 280) and the channel region 225 may be greater than or less than the length between the implanted drain (e.g., the other of source/drain 28) and the channel region 225. In other words, the 2DEG tips 260 are illustrated as being approximately symmetrical in FIG. 2F; however, such approximate (or exact) symmetry may not be desired and/or in practice, such approximate symmetry may be difficult to achieve, for example. Numerous variations and configurations for the source/drain 2DEG tips 260 will be apparent in light of the present disclosure.

In addition, in this example embodiment, replacement gate processing (e.g., replacement metal gate (RMG) processing) was used to form gate dielectric 292 and gate 294. Such replacement gate processing may include any suitable techniques, such as removal of the dummy gate 240 (e.g., removal of the dummy gate electrode and dummy gate oxide) and replacement of the dummy gate 240 with, for example, a hi-k dielectric and a replacement metal gate using any suitable deposition techniques (e.g., CVD, PVD, ALD). In some embodiments, the gate dielectric 292 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 292 to improve its quality when a high-k material is used. In some embodiments, the gate 294 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. A hardmask (not shown) may also be formed on the gate stack to protect it from subsequent processing. In some embodiments, the gate and/or gate dielectric may include a multi-layer structure that has two or more material layers, which may or may not include grading (e.g., increasing and/or decreasing) the content of one or more materials throughout the multi-layer structure. For instance, in some embodiments, gate 294 may include at least one interfacial layer (e.g., at least one work function material layer) to improve interface quality and/or electric properties between the gate dielectric 292 and gate 294 materials, for example. Any number of other suitable processes, such as standard back-end processes, may also be performed to help complete 114 formation of the transistor device.

As can also be seen in FIG. 2F, channel region 225 in base III-V layer 220 is underneath the gate stack (including gate 294 and gate dielectric 292) and between the 2DEG tip portions 260. The gate length Lg is also shown in FIG. 2F. The use of 2DEG tips 260 prevents tip overrun, as previously explained, such that the channel region 225 length tracks very closely with the gate length Lg. In some embodiments, the gate length Lg (and thus, approximately the channel length) may be less than 100 nm (e.g., less than 20 nm) in length, or have any other suitable length maximum, depending on the end use or target application. Further, as a result of the use of 2DEG tips 260, increased channel region 225 length accuracy and consistency can be achieved, leading to greater control over the fabrication process and helping to enable physical scaling. For example, for a given die or substrate including at least two, five, ten, fifty, one hundred, one thousand, or one million transistors having 2DEG tips as variously described herein, the consistency of the channel length in those at least two, five, ten, fifty, one hundred, one thousand, or one million transistors across the die may be within 20, 10, 5, 3, 2, or 1% variation in channel length, or within any other suitable amount as will be apparent in light of the present disclosure. Note that such consistency of channel length may be analyzed using only transistors that are desired to have the same channel length, as a single die may include transistors having various desired channel lengths, for example. This can be compared to implantation tips formed with an anneal process to diffuse/activate such implanted tips, as the anneal process may affect the tip diffusion of each transistor on a single die differently, and thereby create inconsistent tips and inconsistent channel lengths between the transistors. Numerous variations and configurations will be apparent in light of the present disclosure.

Example System

Figure 3:
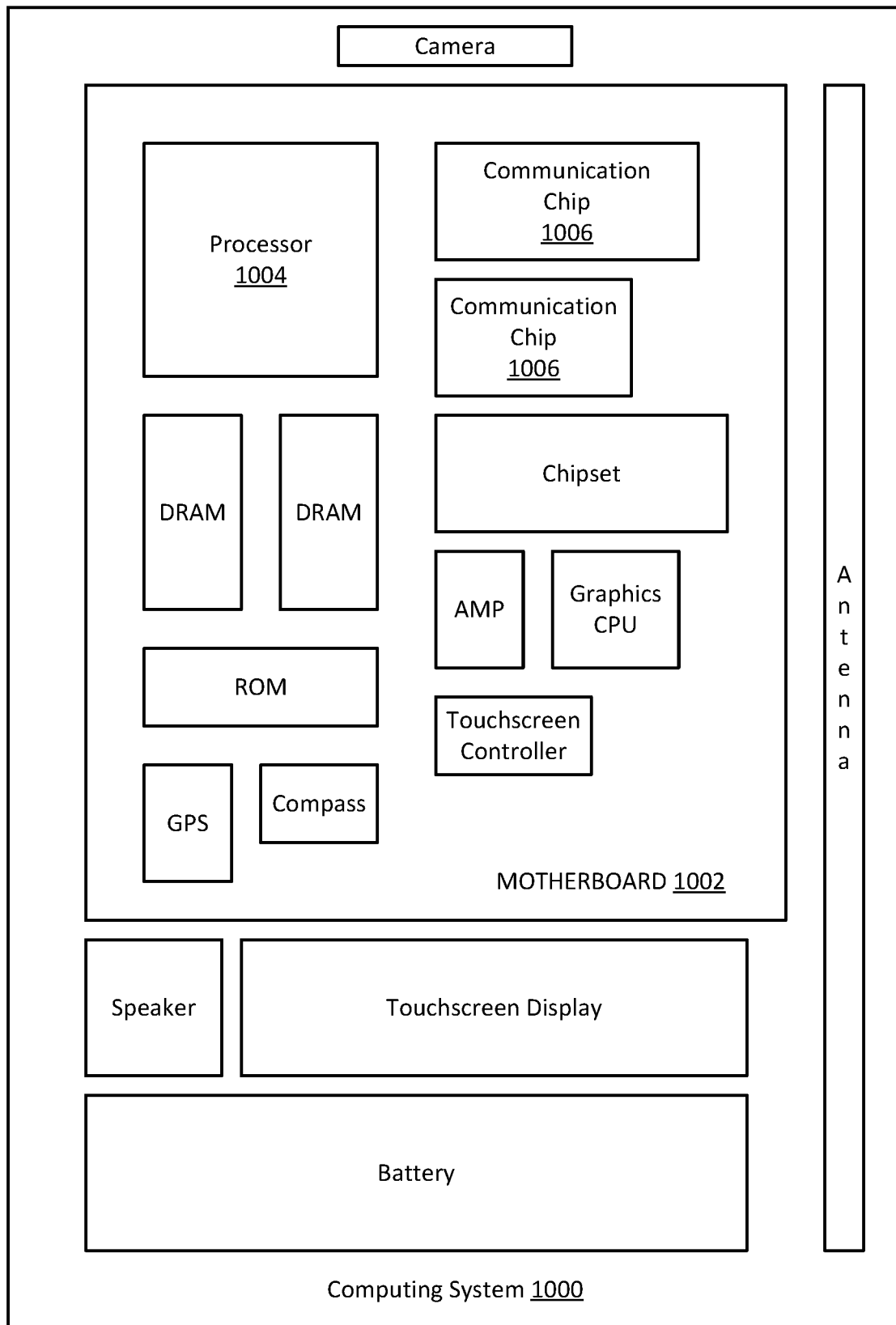
FIG. 3 illustrates a computing system implemented with integrated circuit structures or devices formed using the techniques disclosed herein, in accordance with an embodiment of the present disclosure.

FIG. 3 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a transistor including: a III-V semiconductor material layer; a channel region in the III-V semiconductor material layer; a gate over the channel region; spacers adjacent to the gate; and source and drain regions adjacent to the channel, the source and drain regions each including tip portions located under the spacers; wherein the tip portions each include a polarization layer over the III-V semiconductor material layer.

Example 2 includes the subject matter of Example 1, wherein the tip portions include a two-dimensional electron gas (2DEG) configuration.

Example 3 includes the subject matter of Example 2, wherein the 2DEG configuration is less than 5 nm from the top of the III-V layer.

Example 4 includes the subject matter of any of Examples 1-3, wherein the III-V semiconductor material layer is a group III material-nitride (III-N) compound.

Example 5 includes the subject matter of any of Examples 1-4, wherein the III-V semiconductor material layer includes gallium nitride (GaN).

Example 6 includes the subject matter of any of Examples 1-5, further including an interfacial layer on the III-V layer.

Example 7 includes the subject matter of Example 6, wherein the interfacial layer includes aluminum nitride (AlN).

Example 8 includes the subject matter of any of Examples 1-7, wherein the polarization layer includes at least one of aluminum nitride (AlN), aluminum indium nitride (AlInN), aluminum gallium nitride (AlGaN), and aluminum indium gallium nitride (AlInGaN).

Example 9 includes the subject matter of any of Examples 1-8, wherein the channel region has a length between the tip portions of less than 20 nm.

Example 10 includes the subject matter of any of Examples 1-9, wherein the gate is a metal gate.

Example 11 includes the subject matter of any of Examples 1-10, wherein the transistor is an n-type metal-oxide-semiconductor field-effect transistor.

Example 12 includes the subject matter of any of Examples 1-11, wherein the transistor has a planar configuration.

Example 13 includes the subject matter of any of Examples 1-11, wherein the transistor has a non-planar configuration. In some embodiments, such a non-planar configuration includes a finned or nanowire/nanoribbon configuration.

Example 14 is a complementary metal-oxide-semiconductor (CMOS) device including the subject matter of any of Examples 1-13.

Example 15 is a computing system including the subject matter of any of Examples 1-14.

Example 16 is a transistor including: a gallium nitride (GaN) layer; a gate over the GaN layer; spacers adjacent to the gate; and a polarization layer under the spacers and above the GaN layer, the polarization layer including at least one of aluminum indium nitride (AlInN), aluminum nitride (AlN), aluminum gallium nitride (AlGaN), and aluminum indium gallium nitride (AlInGaN).

Example 17 includes the subject matter of Example 16, further including a substrate, wherein the GaN layer is located over a substrate.

Example 18 includes the subject matter of Example 17, wherein the substrate is a bulk substrate including silicon (Si).

Example 19 includes the subject matter of any of Examples 17-18, further including a nucleation layer between the substrate and the GaN layer.

Example 20 includes the subject matter of any of Examples 16-19, wherein a two-dimensional electron gas (2DEG) is located at or near the interface of the GaN and polarization layers.

Example 21 includes the subject matter of any of Examples 16-20, further including an interfacial layer between the GaN and polarization layers.

Example 22 includes the subject matter of Example 21, wherein the interfacial layer includes AlN.

Example 23 includes the subject matter of any of Examples 16-22, wherein the gate is a replacement metal gate.

Example 24 includes the subject matter of any of Examples 16-23, wherein the transistor is an n-type metal-oxide-semiconductor field-effect transistor.

Example 25 includes the subject matter of any of Examples 16-24, wherein the transistor has a planar configuration.

Example 26 includes the subject matter of any of Examples 16-24, wherein the transistor has a non-planar configuration. In some embodiments, such a non-planar configuration includes a finned or nanowire/nanoribbon configuration.

Example 27 is a complementary metal-oxide-semiconductor (CMOS) device including the subject matter of any of Examples 16-26.

Example 28 is a computing system including the subject matter of any of Examples 16-27.

Example 29 is a method of forming a transistor, the method including: form a dummy gate over a III-V semiconductor material layer; form a polarization layer on either side of the dummy gate; form spacers over the polarization layer; form source and drain regions; and remove the dummy gate and form a replacement gate in the dummy gate location.

Example 30 includes the subject matter of Example 29, further including forming the III-V semiconductor material layer above a substrate.

Example 31 includes the subject matter of Example 30, further including forming a nucleation layer between the III-V semiconductor material layer and the substrate.

Example 32 includes the subject matter of any of Examples 29-31, further including forming an interfacial layer between at least the III-V semiconductor material layer and the polarization layer.

Example 33 includes the subject matter of any of Examples 29-32, wherein the III-V semiconductor material layer is a group III material-nitride (III-N) compound.

Example 34 includes the subject matter of any of Examples 29-33, wherein the III-V semiconductor material layer includes gallium nitride (GaN).

Example 35 includes the subject matter of any of Examples 29-34, wherein the polarization layer includes at least one of aluminum nitride (AlN), aluminum indium nitride (AlInN), aluminum gallium nitride (AlGaN), and aluminum indium gallium nitride (AlInGaN).

Example 36 includes the subject matter of any of Examples 29-35, wherein the source and drain regions are n-type doped.

Example 37 includes the subject matter of any of Examples 29-36, wherein the transistor has a planar configuration.

Example 38 includes the subject matter of any of Examples 29-36, wherein the transistor has a non-planar configuration. In some embodiments, such a non-planar configuration includes a finned or nanowire/nanoribbon configuration.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
    a first layer including gallium and nitrogen;
    a gate structure at least above the first layer;
    a second layer above the first layer and adjacent to opposite sides of the gate structure, the second layer including nitrogen and at least one of aluminum, gallium, or indium; and
    a source region and a drain region adjacent to the first layer;
    wherein the gate structure has a length between portions of the second layer of less than 100 nanometers.

2. The integrated circuit of claim 1, wherein the first layer further includes indium.

3. The integrated circuit of claim 1, wherein the at least one of aluminum, gallium, or indium included in the second layer includes aluminum.

4. The integrated circuit of claim 1, further comprising spacer structures adjacent to opposite sides of the gate structure, the spacer structures on the second layer, the spacer structures including one or more dielectrics.

5. The integrated circuit of claim 1, wherein the length between portions of the second layer is less than 20 nanometers.

6. The integrated circuit of claim 1, wherein the source and drain regions include indium and nitrogen.

7. The integrated circuit of claim 1, wherein the source and drain regions include n-type dopant.

8. The integrated circuit of claim 1, wherein the gate structure is adjacent three sides of the first layer.

9. The integrated circuit of claim 1, wherein the gate structure is around a portion of the first layer.

10. The integrated circuit of claim 1, further comprising a complementary metal-oxide-semiconductor (CMOS) circuit including the at least one transistor.

11. A computing system comprising the integrated circuit of claim 1.

12. The integrated circuit of claim 1, wherein the gate structure includes a gate electrode and a gate dielectric, the gate electrode including one or more metals, the gate dielectric between the gate electrode and the first layer.

13. The integrated circuit of claim 12, wherein the second layer is absent between the gate dielectric and the first layer.

14. The integrated circuit of claim 1, further comprising a third layer between the first and second layers, the third layer including nitrogen and at least one of aluminum, gallium, or indium.

15. The integrated circuit of claim 14, wherein the at least one of aluminum, gallium, or indium included in the third layer is aluminum.

16. An integrated circuit including at least one transistor, the integrated circuit comprising:
    a first layer including gallium and nitrogen;
    a gate structure at least above the first layer, the gate structure including a gate electrode and a gate dielectric, the gate electrode including one or more metals, the gate dielectric between the gate electrode and the first layer;
    spacer structures adjacent to opposite sides of the gate structure, the spacer structures including one or more dielectrics; and
    a second layer between the spacer structures and the first layer, the second layer including nitrogen and at least one of aluminum, gallium, or indium;
    wherein the gate structure includes a length of less than 100 nanometers between the spacer structures.

17. The integrated circuit of claim 16, further comprising a bulk silicon substrate, wherein the first layer is between the gate structure and the substrate.

18. The integrated circuit of claim 16, wherein the first layer further includes indium.

19. The integrated circuit of claim 16, further comprising a third layer between the first and second layers, the third layer including aluminum and nitrogen.

20. The integrated circuit of claim 16, wherein the length is less than 20 nanometers between the spacer structures.

* * * * *